United States Statutory Invention Registration [19]

[11] Reg. Number: H894

Halvis [43] Published: Mar. 5, 1991

[54] IR DETECTOR STRUCTURE AND METHOD OF MAKING

[75] Inventor: James Halvis, Severna Park, Md.

[73] Assignee: The United States of America as represented by the Secretary of the Army, Washington, D.C.

[21] Appl. No.: 379,036

[22] Filed: Jul. 13, 1989

[51] Int. Cl.[5] ..... H01L 31/18; G02B 5/20; F21V 9/04

[52] U.S. Cl. ..... 437/3; 437/5; 252/584; 252/587

*Primary Examiner*—John S. Maples
*Assistant Examiner*—Philip Tucker
*Attorney, Agent, or Firm*—Mike J. Zelenka; Roy E. Gordon

[57] ABSTRACT

An IR detector structure is made from a CdTe substrate by polishing the CdTe subtrate, and transferring the cleaned substrate to a chamber for successive epitaxial growth of HgCdTe and CdTe layers insitu without removal reducing contamination at the interfaces due to exposure to the atmosphere.

8 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

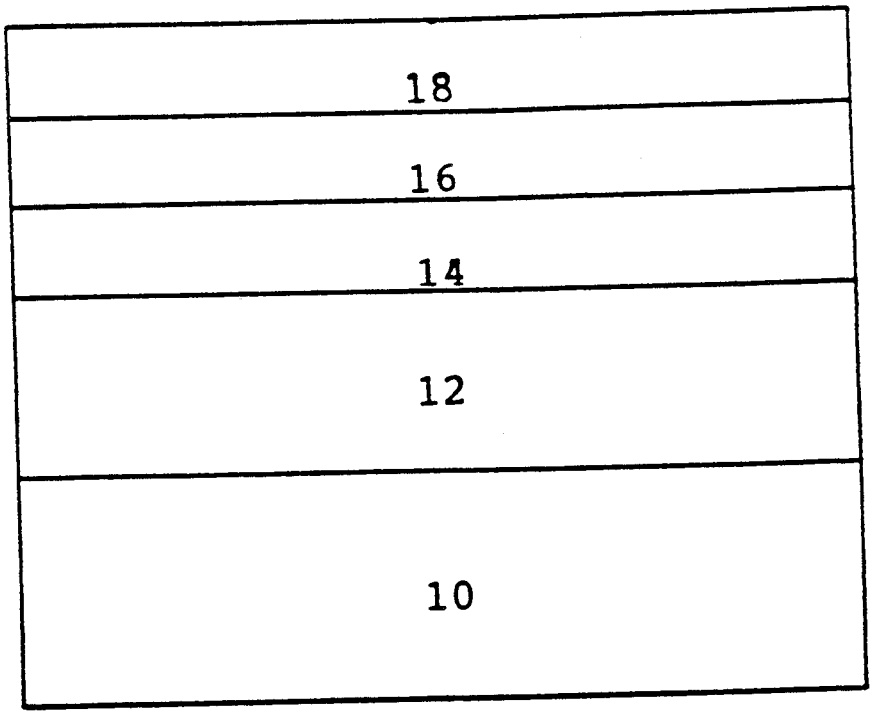
18
16
14
12
10

IR DETECTOR STRUCTURE AND METHOD OF MAKING

The Government has rights in this invention under Contract No. DAABO7-86-C-F069 with the Department of the Army.

This invention relates in general to an IR detector structure and to its method of making and in particular, to such a detector that can be made by molecular beam epitaxy (MBE) or metal oxide chemical vapor deposition (MOCVD) of HgCdTe.

BACKGROUND OF THE INVENTION

A variety of IR detector structures can be fabricated from HgCdTe. One of these detector types is the Metal-Insulator-Semiconductor (MIS). With the MIS detector, a voltage is applied to the insulated gate such that majority carriers are depleted from the area immediately under the gate. Photo-generated minority signal carriers are then collected in the depleted region and read out. The gate level is typically metal and if front-side illumination is desired the metal is kept very thin (<100 angstroms). The very thin metal is difficult to deposit uniformly especially over stepped regions. Also the gate is much too thin to be used for self-aligned implants, if self-aligned implants prove to be useful.

SUMMARY OF THE INVENTION

The general object of this invention is to provide a method of making an IR-detector structure. A more particular object of the invention is to provide a method of making such a structure using HgCdTe photodetector arrays and a transparent gate for the photodetector arrays. A still further object of the invention is to provide such a method wherein the arrays of the detector structure can be front side illuminated and self-aligned implants are possible and in which the gate can be adjusted to act as a cold "cut-on" filter.

It has now been found that the aforementioned objects can be attained by depositing a transparent gate for HgCdTe photodetector arrays insitu during MBE or MOCVD detector material growth.

More particularly a CdTe cap/insulator layer is grown insitu after MBE growth of HgCdTe detector layer(s). The CdTe acts as a high quality dielectric layer since the CdTe growth is done insitu and the CdTe is a good insulator.

A layer of HgCdTe is then grown on the CdTe insulator layer described above. This layer can act as a conductor gate layer for MIS structures. The crystal quality of the layer is not critical since the layer functions primarily as a conductor. Also, the gate layer composition will have a relatively high cadmium telluride mole fraction (compared to the detector layer) making the gate transparent at the detector's absorption wavelength. If desired, the composition of the gate material can be adjusted for the gate to act as a "cut-on" filter. The HgCdTe transparent gate layer can be preferentially etched over the CdTe insulator using a dry etch to form the desired gate pattern. The gate layer is also relatively dense and can be grown reasonably thick (a few tenths of a micron) to act as a blocking layer for self-aligned implants.

DESCRIPTION OF THE DRAWING

The drawing is a cross sectional view of a detector structure according to the invention.

Referring to the drawing, there is shown a CdTe substrate 10 of about 10 mils in thickness upon which is epitaxially grown insitu a layer of HgCdTe narrow gap or absorber layer, 12. This layer is the detector layer and is about 10 micrometers in thickness. Upon layer 12, there is epitaxially grown insitu an HgCdTe wide gap or signal storage layer, 14 of about 0.1 micrometer to 1 micrometer in thickness. Upon layer 14, there is epitaxially grown insitu a CdTe insulator layer, 16 of about 0.1 to 0.2 micrometer in thickness. Upon layer 16, there is epitaxially grown insitu a HgCdTe wide gap or gate layer, 18 of about 0.5 micrometer in thickness.

The structure allows for detector arrays to be front-side illuminated. Implants self-aligned to the transparent gate can also be implemented. Then too, the gate material can be deposited insitu during MBE or MOCVD detector and insulator layer growth. The gate can also act as a cold "cut-on" filter for the LWIR or MWIR detectors. The number of post growth fabrication steps are also reduced.

DESCRIPTION OF THE PREFERRED EMBODIMENT

A CdTe or CdZnTe substrate is polished using one of several surface preparation techniques, for example a light surface etch in a dilute solution of Bromine/Methanol. The substrate thickness is not critical for this device structure since the active detector area will be illuminated from the front (gate) side. The cleaned substrate is then transferred to an MBE or MOCVD chamber for epitaxial growth of HgCdTe and CdTe layers. These epitaxial layers should be grown successively in the MBE or MOCVD chamber without removal. This reduces contamination at the interfaces due to exposure to the atmosphere.

MBE epitaxial growth is achieved by codeposition of Mercury, Tellurium and Cadmium Telluride onto the substrate which is heated to about 200° C. Deposition rate and composition are controlled by adjusting the temperature of the effusion source cells for the Hg, Te and CdTe. Approximate temperatures would be 700° C. for CdTe, 400° C. for Te and 200° C. for Hg. MOCVD epitaxial growth is achieved on substrates heated to about 400°0 C. by chemical vapor deposition. Typical gas sources are dimethylcadmium for Cd and diethyltelluride for Te. Elemental mercury is provided by evaporation. Several alternate gas sources are also used with, in general, different substrate temperatures.

Epitaxial growth of HgCdTe by MBE and MOCVD has been demonstrated on several crystal orientation substrates. The most popular orientations being (100), (111) and (211). The first epitaxial layer to be grown is a narrow gap HgCdTe layer. A typical thickness for longwave IR applications would be 10 μm. By narrow (band) gap is meant a layer whose Cadmium mole fraction (X) is adjusted to absorb infra-red radiation of the desired long wavelength. For example, a Cadmium mole fraction of 0.22 would result in a cutoff wavelength of about 10 μm at 77K. The variable band gap properties of HgCdTe are well known in the industry.

Film carrier type by either epitaxial growth technique can be controlled by stoichiometry. For example, a mercury excess will result in an n-type film and a mercury deficiency will result in a p-type film. Carrier type can also be controlled by extrinsic doping by any one of several techniques. The narrow gap and wide gap layers shown in the drawing must be of the same electrical type. The wide gap epitaxial layer is grown next. By wide (band) gap is meant a Cadmium mole fraction which is greater than the narrow gap absorber layer and will thus be transparent to radiation which is absorbed in the narrow gap layer. A typical thickness of the wide gap layer would be 0.5 μm. This layer is the detector depletion region in which photogenerated signal charge is stored.

A CdTe electrical insulating layer is grown next by suppressing the Te and Hg sources during MBE growth or the Te source during MOCVD growth. This CdTe layer forms the insulator of the MIS (metal-insulator-semiconductor) structure. By qrowing the CdTe layer epitaxially, insitu, a minimum of interface states will result.

The final layer of the MIS structure is the transparent HgCdTe gate. The addition of this layer is the basis of this invention. The layer is grown epitaxially, insitu, in the MOCVD or MBE growth chamber. The crystal quality of this gate level is not critical since the layer acts only as an electrically conducting region and is not used for signal charge transport. The gate is transparent for frontside illumination because the cadmium mole fraction is adjusted to allow transmission of longer wavelength radiation which is then absorbed in the narrow gap layer.

I wish it to be understood that I do not desire to be limited to the exact details of construction shown and described for obvious modification will occur to a person skilled in the art.

What is claimed is:

1. Method of making an IR detector structure from a CdTe substrate, said method including the steps of:

(A) polishing the CdTe substrate (B) transferring the cleaned substrate to a chamber for successive epitaxial growth of HgCdTe and CdTe layers insitu without removal reducing contamination at the interfaces due to exposure to the atmosphere, (C) growing an epitaxial layer of a narrow gap HgCdTe of about 10 μm in thickness onto the CdTe substrate (D) growing an epitaxial layer of wide gap HgCdTe of about 0.5 μm in thickness onto the narrow gap layer, (E) growing an electrical insulating epitaxial layer of CdTe of about 0.1 to 0.2 μm in thickness onto the wide gap layer of HgCdTe, and (F) growing an epitaxial transparent HgCdTe gate layer of about 0.5 μm in thickness onto the CdTe layer.

2. Method according to claim 1 where in step (A) the CdTe substrate is polished with a light surface etch in a dilute solution of bromine/methanol.

3. Method according to claim 1 where in step (B) the chamber for epitaxial growth is selected from the group consisting of MBE and MOCVD.

4. Method according to claim 3 where in step (B) the chamber is MBE.

5. Method according to claim 3 wherein step (B) the chamber is MOCVD.

6. Method according to claim 4 wherein MBE epitaxial growth is achieved by codeposition of mercury, tellurium and cadmium telluride onto the substrate which is heated to about 200° C. and wherein deposition rate and composition are controlled by adjusting the temperature of the effusion source cells for the Hg, Te and CdTe, approximate temperature being about 700° C. for CdTe, about 400° C. for Te, and about 200° C. for Hg.

7. Method according to claim 5 wherein MOCVD epitaxial growth is achieved on substrates heated to about 400° C. by chemical vapor deposition, typical gas sources being demethylcadmium for Cd and diethyltelluride for Te, elemental mercury being provided by evaporation.

8. An IR detector structure, said structure comprising a cadmium telluride substrate, an epitaxial layer of narrow gap HgCdTe on said substrate and wherein said epitaxial layer has been grown insitu, a wide gap epitaxial layer of HgCdTe on said narrow gap layer and wherein said wide gap layer has been grown insitu, a CdTe electrical insulating layer epitaxially grown insitu on said wide gap layer, and a transparent HgCdTe gate layer grown epitaxially, insitu, on said CdTe layer.

* * * * *